United States Patent [19]

Alberkrack et al.

[11] Patent Number: 4,825,144

[45] Date of Patent: Apr. 25, 1989

[54] DUAL CHANNEL CURRENT MODE SWITCHING REGULATOR

[75] Inventors: Jade H. Alberkrack; W. David Pace, both of Tempe, Ariz.

[73] Assignee: Motorola, Inc., Schaumburg, Ill.

[21] Appl. No.: 118,927

[22] Filed: Nov. 10, 1987

[51] Int. Cl.$^4$ .............................................. G05F 1/577
[52] U.S. Cl. ........................................ 323/272; 363/71
[58] Field of Search ....................... 323/266, 267, 272; 363/71, 131

[56] References Cited

U.S. PATENT DOCUMENTS

| | | | |
|---|---|---|---|
| 3,562,623 | 2/1971 | Farnsworth | 363/20 |
| 4,386,311 | 5/1983 | Bafaro | 363/71 X |
| 4,694,227 | 9/1987 | Doman | 323/272 X |

Primary Examiner—Patrick R. Salce
Assistant Examiner—Kristine Peckman
Attorney, Agent, or Firm—Michael D. Bingham

[57] ABSTRACT

A dual channel switching regulator is disclosed comprising a pair of current mode pulse width modulated controllers synchronized to a single oscillator with the input of the first one of pair of controllers being directly coupled to the oscillator while the input of the second one of the pair of controllers is coupled via an inverter to the output of the oscillator. The pair of controllers are thus operated on alternate half cycles of the output of the oscillator such that the turn off transients of one controller does not affect the other and vice versa. Hence, the switching regulator provides two independent regulated output voltages from an unregulated source.

2 Claims, 2 Drawing Sheets

DUAL CHANNEL CURRENT MODE SWITCHING REGULATOR

BACKGROUND OF THE INVENTION

The present invention relates to controllers and more particularly to current mode pulse width modulation (PWM) controllers for providing output regulated control.

There is presently a need for a single integrated dual current mode switching regulator circuit. For example, remote controlled television sets often require multiple switching regulators for driving high and low power supplies. The low voltage power supply is utilized to provide low power output to drive the remote control circuit which must be on in order to respond to the users remote control unit while the high power supply, which drives the television receiver and cathode ray tube, is only turned on when the television set is turned on by the user.

Prior art current mode switching regulator integrated circuits do not provide dual channel operation. Multiple output power supplies have been built in the past with separate PWM regulator integrated circuits driven by external circuitry to synchronizes the switching regulators to a common oscillator. However, these prior art systems have suffered in that unwanted crosstalk or interference between the two regulator channels occur. This crosstalk results in a spike occurring in one of the two channels that can cause early turn off of the other of the two channels. This is highly undesirable because it causes output instability.

Hence, a need exists for a dual current mode switching regulator that is economical and which can provide dual output regulation without suffering from the problems of the prior art.

SUMMARY OF THE INVENTION

Accordingly, it is an object of the present invention to provide improved current mode switching regulation.

It is another object of the present invention to provide an improved integrated dual current mode switching regulator.

Yet another object of the present invention is to provide an improved integrated pulse width modulated regulator having dual output control.

In accordance with the above and other objects there is provided a dual current mode switching regulator comprising a pair current mode PWM controllers synchronized to a single oscillator wherein the output of the oscillator is directly supplied to a first one of the controllers and is coupled through an inverter to the input of the second one of the controllers.

DETAILED DESCRIPTION OF THE PREFERRED EMBODIMENT

Figure 1:
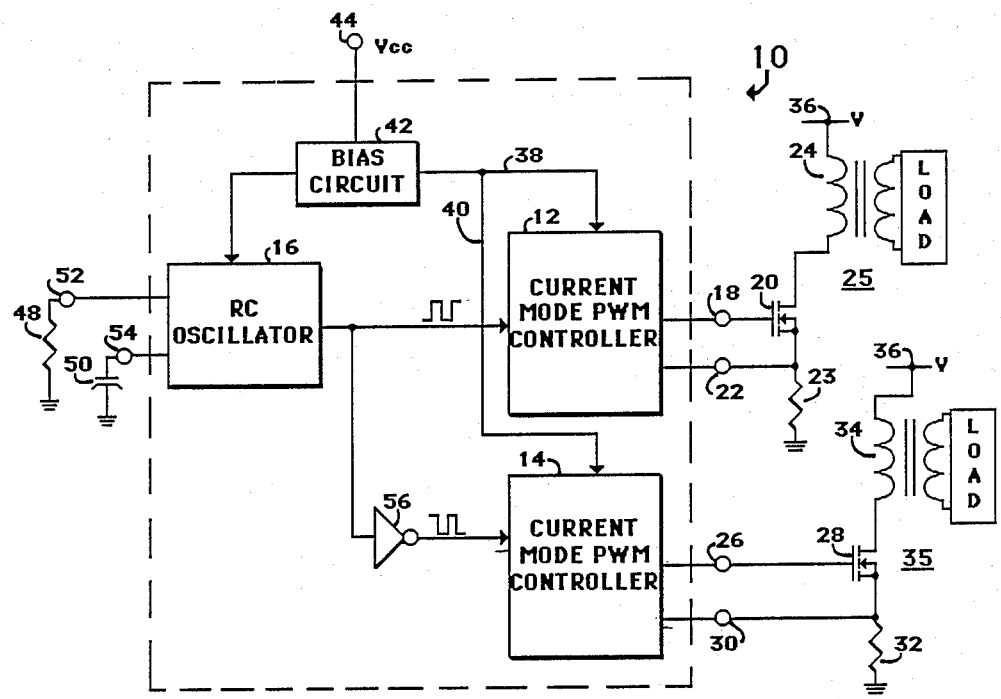
FIG. 1 is a partial block and schematic diagram of the dual current mode switching regulator of the preferred embodiment.

Turning now to the Figures there is shown dual current mode switching regulator 10 of the present invention. It is understood that like components in the drawings are designated by the same reference numbers. Further, it is understood that the dual current mode switching regulator is suited to be manufactured in integrated circuit form as indicated by the circuit included within the dashed outline form.

Figure 2:
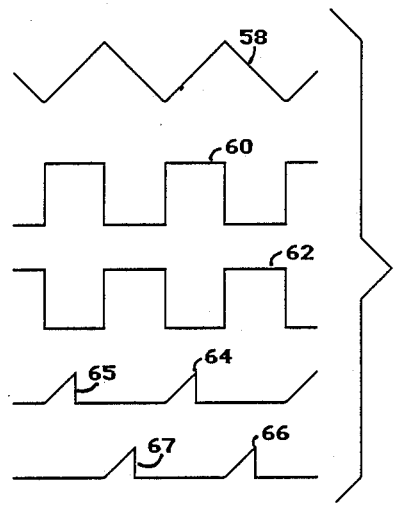
FIG. 2 illustrates waveforms that are useful for understanding the operation of the present invention.

In particular, referring to FIGS. 1 and 2, there is shown dual current mode switching regulator 10 which comprises a pair of current mode PWM controllers 12 and 14. Controllers 12 and 14 are generally known in the art and will be described in detail later. However, in the past, each controller 12 and 14 available in the prior art would have a separate oscillator which the present invention eliminates the need therefor. In the present invention controllers 12 and 14 are synchronized to a single RC oscillator 16 the output of which is directly coupled to an input of controller 12. The output of controller 12 is externally coupled to output terminal 18 and controls the conduction of transistor 20 of first external utilization means 25. Feedback control is provided to controller 12 at terminal 22 by sampling the voltage developed across resistor 23, the latter being coupled between the source of transistor 20 and ground potential. The drain of transistor 20 is coupled to one end of coil 24 the other end of which is coupled to a voltage source at 36. Similarly, controller 14 includes an output coupled externally to transistor 28 of second utilization means 35 at output terminal 26. Feedback control to controller 14 is provided at input terminal 30 by the voltage developed across resistor 32. The drain and source of transistor 28 is coupled between one end of coil 34 and resistor 32 respectively. The other end of coil 34 is returned to lead 36 while that of resistor 32 is returned to ground reference. Transistor 28, resistor 32 and coil 34 comprise a second utilization means. The oscillation frequency of RC oscillator 16 is determined by resistor 48 and capacitive 50 which are respectively coupled to terminals 52 and 54 of regulator 10. The output of oscillator 16 is inverted and supplied to controller 14 via inverter 56. Operating bias to the circuit is provide from bias circuit 42 which receives a source of operating potential, Vcc, at terminal 44 and drives both controllers via leads 38 and 40 as well as oscillator 16.

In operation, switching regulator 10 generates two independent pulse width modulated control signals at terminals 18 and 26 from source Vcc. As illustrated by waveform 58, which is the voltage developed across capacitor 50, oscillator 16 is preferably operated at a fifty (50%) per cent duty cycle and produces a rectangular output (waveform 60) at its output which is directly coupled to controller 12. The output of oscillator is inverted (waveform 62) and applied to controller 14. By operating oscillator 16 at 50% duty cycle and inverting the input to controller 14, the output conduction intervals of each controller is initiated on alternate half cycles of the output of oscillator 16. As respective transistors 20 and 28 are turned on by the initiation of the output conduction cycle from its associated controller current is sourced to respective resistors 23 and 32. When the voltage developed across respective resistors 23 and 32 reaches a predetermined magnitude the appropriate controller is turned off.

For example, in response to the negative going edge of inverted oscillator 16 output(waveform 62) controller 14 is rendered operative to turn on transistor 28. As transistor 28 turns on, a voltage is developed across resistor 32 (waveform 64) which due to the time constant of coil 34, begins to ramp upward. Controller 14 will be turned off as the voltage across resistor 32 reaches a maximum value, in turn, turns off transistor 28 thereby causing the voltage across resistor 32 to decrease rapidly to zero (see portion 65) of waveform 64. Similarly, controller 12 is rendered operative in response to the negative going edge of waveform 60 and is then turned off by the voltage across resistor 23 reaching a maximum value (portion 67 of waveform 66). Because each controller switches on and off during the separate half-cycles, switching transients from one controller cannot interfere with the noise sensitive functions of the other controller. It is noted that oscillator 16 is operated at the same frequency as the output switching frequency of regulator 10. This improves the oscillator frequency tolerance by reducing the required oscillator frequency for a given switching regulator.

Figure 3:
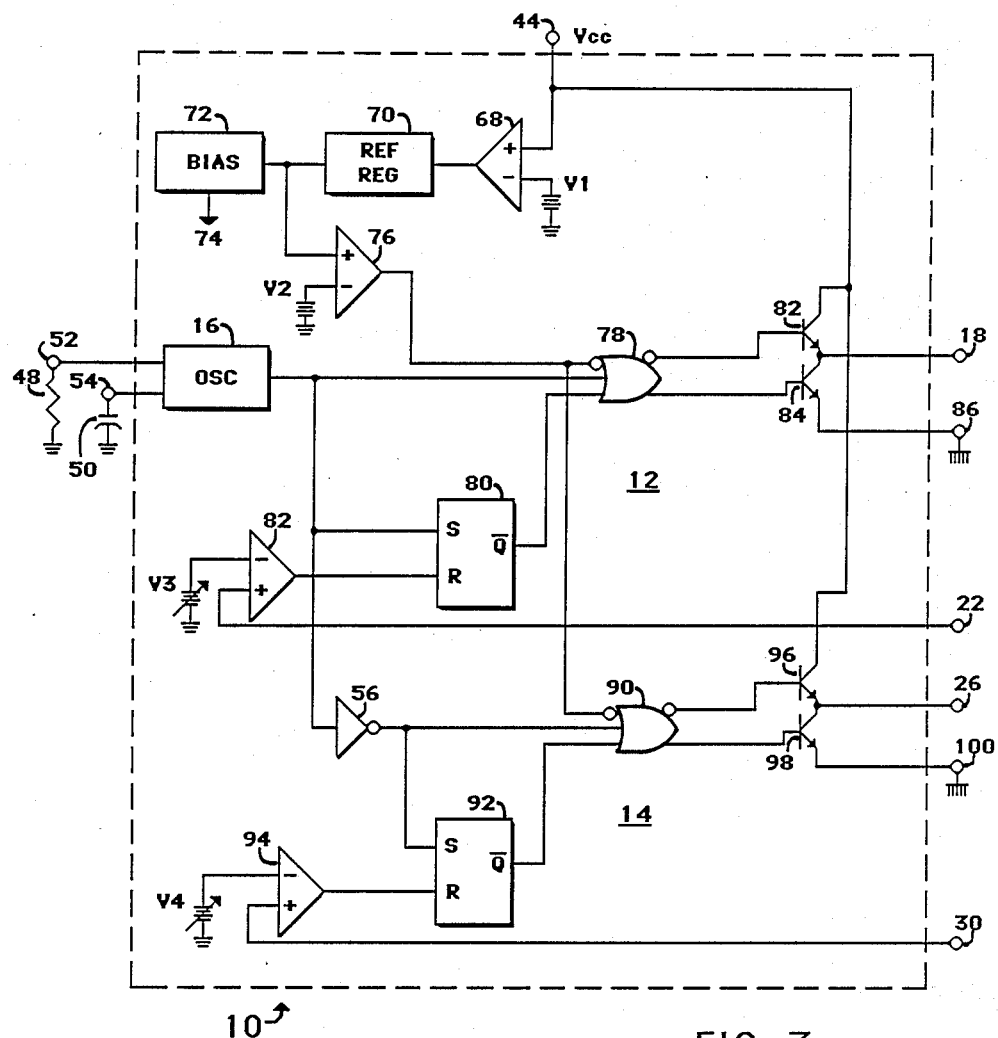
FIG. 3 is a more complete partial schematic and block diagram of the embodiment of FIG. 1.

Turning now to FIG. 3 switching regulator 10 is shown in more detail. The unregulated voltage Vcc is sensed by comparator 68 which provides an output signal whenever Vcc is greater than the reference voltage V1 to reference regulator 70. Internal regulator 70 in turn drives bias circuit 72 the latter which provides a regulated output voltage to the internal circuitry of switching regulator 10. Controller 12 includes NOR gate 78 having a plurality of inputs, an inverted input being coupled to the output of comparator 76. Comparator 76 compares the output of reference regulator 70 to a second reference voltage V2 and supplies an enabling signal at its output whenever the regulated voltage is greater than V2. The other inputs of NOR gate 78 are coupled respectively to the output of oscillator 16 and the $\overline{Q}$ output of RS flip flop 80. An inverted output of NOR gate 78 is coupled to the base of transistor 82 while a second output is coupled to the base of transistor 84. The emitter of transistor 82 is interconnected with the collector of transistor 84 to output terminal 18 while the collector of the former is coupled to Vcc. The emitter of transistor 84 is coupled at terminal 86 to system ground. Controller 12 also includes comparator 82 which provides an reset signal at its output to the reset terminal of flip flop 80 whenever the magnitude of the voltage developed across resistor 23 exceeds the error control voltage V3. The set terminal of flip flop 80 is coupled to the output of oscillator 16.

Similarly, controller 14 includes NOR gate 90 having an inverted input coupled to the output of comparator 76, a second input coupled to the output of inverter 56 and a third input coupled to the $\overline{Q}$ output of RS flip flop 92. The set and reset inputs of flip flop 92 are coupled to the outputs of inverter 56 and comparator 94 respectively. Comparator 94 will provide an output to reset flip flop 92 whenever the magnitude of the voltage developed across resistor 32 exceeds error control voltage V4. Both error control voltages V3 and V4 are feedback voltages supplied from respective utilization means 25 and 35 which vary in magnitude to control the regulation of the output voltages to the two loads. An inverted output of NOR gate 90 is coupled to the base of transistor 96 while the non-inverted output is coupled to the base of transistor 98. The interconnected emitter of transistor 96 and collector of transistor 98 are coupled to output terminal 26 while the collector of the former is coupled to Vcc and the emitter of the latter is coupled at terminal 100 to system ground.

Assuming a steady state switching operation, the operation of switching regulator 10 will now be explained in greater detail. Because controller 14 operates in the same manner as Controller 12 only the operation of the latter is describe, it being understood that controller 14 operates on alternating half cycles of output from oscillator 16. With a regulated reference voltage greater than V2 a logic one is supplied at the inverted input of NOR gates 78 and 90. Thus, a logic zero is applied to the non-inverted input of these gates. Hence, in response to the negative going edge of the output waveform from oscillator 16 the other two inputs to NOR gate 78 are at a logic zero. With all inputs at a logic zero the non-inverted output of the gate is at a logic zero. Transistor 84 will therefor be turned off. However, transistor 82 is turned on since the output of gate 78 supplied thereto is inverted and a logic one is supplied to the base of the transistor. (It is noted that at this time the output of oscillator is inverted via inverter 56 which in conjunction with the $\overline{Q}$ output of flip flop 80 will cause NOR gate 90 to maintain transistor 96 turned off and transistor 98 turned on.) As transistor 82 turns on current is sourced through transistor 20 and the voltage across resistor 23 begins to ramp upward. This voltage will continue to ramp up until it exceeds the value of V3. At this time the output of comparator 82 goes high which causes flip flop 80 to be reset. In response, the $\overline{Q}$ output of flip flop 80 goes high which causes the outputs of NOR gate to switch, i.e., the inverted output goes low while the non-inverted output goes high. Thus, transistor 82 is turned off and transistor 84 is turned on. Transistor 84 rapidly causes the load transistor 20 to be turned off which also rapidly switches off the feedback signal from resistor 23 to comparator 82. Upon the next alternating half cycle when the output of oscillator goes negative flip flop 92 is set while flip flop 80 remains in a reset state. Thus transistor 96 is turned on until such time as reset by the feedback signal developed across resistor 32 exceeding the magnitude of V4.

Thus, what has been described above is a novel dual current mode switching regulator for generating two independent regulated output signals including a pair of controllers synchronized to a 50% duty cycle oscillator. The controllers are operated on alternating half cycles of the oscillator output whereby switching transients generated by one controller does not affect the operation of the other controller as the one controller is turned off.

We claim:

1. A dual channel current mode switching regulator for providing two independent output control currents at respective outputs at which first and second load utilization means are connected, each of the first and second load utilization means including a control transistor, comprising:

a first controller circuit for providing the first one of the output control currents at a first one of the outputs of the regulator, said first controller circuit having first and second inputs and an output, said output being coupled to the first output of the regulator, said first input being coupled to a first input of the regulator for receiving a first feedback signal the magnitude of which is proportional to the current flowing through the control transistor of the first load utilization means, said first controller circuit including a comparator for comparing the magnitude of a first error voltage generated from the first load utilization means to said magnitude of said first feedback signal such that the first output control current is terminated whenever said magnitude of said first feedback signal exceeds said magnitude of said first error voltage;

a second controller circuit for providing the second of the output control currents at a second one of the outputs of the regulator, said second controller circuit having first and second inputs and an output, said output being coupled to the second output of the regulator, said first input being coupled to a second input of the regulator for receiving a second feedback signal the magnitude of which is proportional to the current flowing through the control transistor of the second load utilization means, said second controller circuit including a comparator for comparing the magnitude of an error voltage generated from the second load utilization means to said magnitude of said second feedback signal such that the second output control current is terminated whenever said magnitude of said second feedback signal exceeds said magnitude of said second error voltage;

an oscillator for providing a single predetermined duty cycle oscillation signal at an output thereof, said output being coupled to said second input of said first controller circuit; and an inverter coupled between said output of said oscillator and said second input of said second controller circuit for inverting the oscillation signal supplied thereto such that said first and second controller circuits are rendered operative on alternating cycle of said oscillation signal.

2. A switching regulator for providing separate control operation of two independently operated load control transistors, comprising:

an oscillator for providing a single periodic oscillation signal at an output;

circuit means coupled to said oscillator output for inverting said oscillation signal;

a first controller circuit responsive to said oscillation signal for providing a first control signal at an output to control the conduction of the first one of the load control transistors, said first controller circuit including circuit means for comparing the magnitude of a first variable error voltage to a first feedback signal derived from current flow through said first load control transistor to provide a second control signal at said output which terminates the conduction of said first load control transistor whenever the magnitude of said first feedback signal exceeds the magnitude of said first error voltage; and a second controller circuit responsive to said inverted oscillation signal for providing a first control signal at an output to control the conduction of the second of the load control transistors, said second controller circuit including circuit means for comparing the magnitude of a second variable error voltage to a second feedback signal derived from current flow through said second load control transistor to provide a second control signal at said output which terminates the conduction of said second load control transistor whenever the magnitude of said second feedback signal exceeds the magnitude of said second error voltage.

* * * * *